United States Patent
Lo et al.

(10) Patent No.: US 11,587,973 B2
(45) Date of Patent: Feb. 21, 2023

(54) MICRO LIGHT-EMITTING DIODE DISPLAY PANEL

(71) Applicant: PlayNitride Display Co., Ltd., MiaoLi County (TW)

(72) Inventors: Yu-Yun Lo, MiaoLi County (TW); Sheng-Yuan Sun, MiaoLi County (TW); Chih-Ling Wu, MiaoLi County (TW); Yen-Yeh Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 159 days.

(21) Appl. No.: 16/852,558

(22) Filed: Apr. 20, 2020

(65) Prior Publication Data

US 2021/0175278 A1  Jun. 10, 2021

(30) Foreign Application Priority Data

Dec. 4, 2019 (TW) .................................. 108144232

(51) Int. Cl.
| | |
|---|---|
| *H01L 33/38* | (2010.01) |
| *H01L 33/60* | (2010.01) |
| *H01L 27/15* | (2006.01) |
| *H01L 33/42* | (2010.01) |

(Continued)

(52) U.S. Cl.
CPC .......... *H01L 27/156* (2013.01); *H01L 33/387* (2013.01); *H01L 33/42* (2013.01); *H01L 33/505* (2013.01); *H01L 33/58* (2013.01); *H01L 33/60* (2013.01); *H01L 2933/0091* (2013.01)

(58) Field of Classification Search
CPC ........... H01L 27/156; H01L 33/50–508; H01L 33/00–648
See application file for complete search history.

(56) References Cited

U.S. PATENT DOCUMENTS

| 9,825,016 B1 * | 11/2017 | Kim ....................... H01L 27/124 |
| 10,103,995 B1 | 10/2018 | Baveja et al. |
| 10,381,400 B2 | 8/2019 | Daikoku et al. |

(Continued)

FOREIGN PATENT DOCUMENTS

| CN | 207705197 | 8/2018 |
| CN | 108933153 | 12/2018 |

(Continued)

OTHER PUBLICATIONS

"Office Action of Taiwan Counterpart Application", dated Jun. 15, 2020, p. 1-p. 5.

(Continued)

*Primary Examiner* — Didarul A Mazumder
*Assistant Examiner* — Gustavo G Ramallo
(74) *Attorney, Agent, or Firm* — JCIPRNET

(57) ABSTRACT

A micro light-emitting diode display panel includes a substrate, a plurality of pixel structures, and a plurality of wavelength conversion structures. The pixel structures are disposed on the substrate. Each pixel structure includes a plurality of micro light-emitting diodes. The micro light-emitting diodes are formed by a plurality of different portions of a connected epitaxial structure. The wavelength conversion structures are disposed in the epitaxial structure and are respectively aligned with at least a portion of the micro light-emitting diodes.

14 Claims, 4 Drawing Sheets

(51) Int. Cl.
*H01L 33/58* (2010.01)
*H01L 33/50* (2010.01)

(56) References Cited

U.S. PATENT DOCUMENTS

| | | | |
|---|---|---|---|
| 2012/0169786 A1* | 7/2012 | Okuyama | H01L 33/54 362/249.02 |
| 2015/0362165 A1* | 12/2015 | Chu | H01L 33/32 362/235 |
| 2017/0032735 A1 | 2/2017 | Lee et al. | |
| 2017/0294479 A1 | 10/2017 | Cha et al. | |
| 2017/0358624 A1* | 12/2017 | Takeya | H01L 33/42 |
| 2018/0166424 A1 | 6/2018 | Sim et al. | |
| 2019/0181181 A1 | 6/2019 | Yeon et al. | |
| 2019/0229098 A1* | 7/2019 | Hsieh | H01L 27/156 |
| 2019/0378873 A1* | 12/2019 | Lee | H01L 33/58 |
| 2020/0051963 A1 | 2/2020 | Gootz | |
| 2020/0212267 A1* | 7/2020 | Kwak | H01L 33/24 |
| 2020/0349882 A1* | 11/2020 | Kim | H01L 51/502 |
| 2021/0013236 A1* | 1/2021 | Sakong | H01L 33/54 |
| 2021/0193639 A1* | 6/2021 | Robin | H01L 33/505 |

FOREIGN PATENT DOCUMENTS

| | | |
|---|---|---|
| CN | 109791939 | 5/2019 |
| CN | 110265531 | 9/2019 |
| CN | 110518107 | 11/2019 |
| DE | 102014112551 | 3/2016 |
| JP | 2019526925 | 9/2019 |
| JP | 2019529989 | 10/2019 |
| TW | 201941453 | 10/2019 |
| WO | 2018116814 | 6/2018 |
| WO | 2019093533 | 5/2019 |
| WO | 2019112206 | 6/2019 |

OTHER PUBLICATIONS

"Office Action of Japan Counterpart Application", dated Sep. 22, 2021, p. 1-p. 4.
"Notice of allowance of China Counterpart Application", dated Jul. 21, 2021, p. 1-p. 4.
"Office Action of China Counterpart Application", dated Mar. 1, 2021, pp. 1-9.
"Office Action of German Counterpart Application", dated Sep. 14, 2022, p. 1-p. 7.

* cited by examiner

MICRO LIGHT-EMITTING DIODE DISPLAY PANEL

CROSS REFERENCE TO RELATED APPLICATION

This application claims the priority benefit of Taiwan application serial no. 108144232, filed on Dec. 4, 2019. The entirety of the above-mentioned patent application is hereby incorporated by reference herein and made a part of specification.

BACKGROUND OF THE INVENTION

1. Field of the Invention

The invention relates to a display panel, and in particular relates to a micro light-emitting diode display panel.

2. Description of Related Art

In a micro light-emitting diode display, a plurality of vertical micro light-emitting diodes may be arranged into an array and disposed on a micro light-emitting diode display panel. At present, a transparent conductive layer (such as an indium tin oxide) is generally used as a common electrode. In this way, the plurality of vertical micro light-emitting diodes may be electrically connected to each other, and that the micro light-emitting diode display may operate. However, as the size of the display is enlarged, the thickness of the indium tin oxide as a common electrode also needs to be increased to maintain transverse conductivity and low power consumption. However, the increase in the thickness of the common electrode leads to decrease in the light output rate of the display, and the problem of light leakage is thereby caused. Furthermore, a color conversion structure disposed on the micro light-emitting diode display panel and configured to perform color conversion will cause a surface to be uneven, and thereby, the manufacturing yield of subsequent common electrodes is reduced.

SUMMARY OF THE INVENTION

The invention is directed to a micro light-emitting diode display panel capable of increasing a light output rate and reducing light leakage.

A micro light-emitting diode display panel of the invention includes a substrate, a plurality of pixel structures, and a plurality of wavelength conversion structures. The pixel structures are disposed on the substrate. Each pixel structure includes a plurality of micro light-emitting diodes. The micro light-emitting diodes are formed by a plurality of different portions of a connected epitaxial structure. The wavelength conversion structures are disposed in the epitaxial structure and are respectively aligned with at least a portion of the micro light-emitting diodes.

In an embodiment of the invention, the above-mentioned epitaxial structure includes a first type semiconductor layer at least partially connected, a plurality of light-emitting layers separated from each other, and a plurality of second type semiconductor layers separated from each other. The light-emitting layers are disposed between the first type semiconductor layer and the second type semiconductor layers.

In an embodiment of the invention, a thickness of each of the wavelength conversion structures is greater than a thickness of a connected portion of the first type semiconductor layer.

In an embodiment of the invention, the micro light-emitting diode display panel meets a condition that: $1 \leq A/B \leq 50$, $1.5 \leq A/C \leq 70$, and $1.5 \leq B/C \leq 15$. A is a thickness of the wavelength conversion structures, B is a thickness of a connected portion of the first type semiconductor layer, and C is a distance e from the connected portion of the first type semiconductor layer to one end of each second type semiconductor layer away from the wavelength conversion structures in a direction perpendicular to the substrate.

In an embodiment of the invention, a thickness of an unconnected portion of the first type semiconductor layer of the epitaxial structure is greater than a thickness of a connected portion.

In an embodiment of the invention, a ratio of a thickness of the unconnected portion to a thickness of the wavelength conversion structure is between 0.9 and 1.1.

In an embodiment of the invention, the micro light-emitting diode display panel further includes a common electrode layer. The common electrode layer is disposed on the pixel structures and electrically connected to the first type semiconductor layer.

In an embodiment of the invention, one end of a portion of the epitaxial structure away from the substrate is coplanar with one end of each wavelength conversion structure away from the substrate.

In an embodiment of the invention, the micro light-emitting diode display panel further includes a light blocking layer. The light blocking layer is disposed between the epitaxial structure and the wavelength conversion structures.

In an embodiment of the invention, the light blocking layer has electrical conductivity.

In an embodiment of the invention, a spacing between the micro light-emitting diodes is less than a width of each micro light-emitting diode.

In an embodiment of the invention, a ratio of the spacing between the micro light-emitting diodes and the width of each micro light-emitting diode ranges from 0.1 to 0.9.

In an embodiment of the invention, the spacing between the micro light-emitting diodes is less than or equal to 10 micrometers.

In an embodiment of the invention, the micro light-emitting diode display panel further includes a separation layer. The separation layer is disposed on side walls of the micro light-emitting diodes and on the connected portion of the epitaxial structure among the micro light-emitting diodes.

In an embodiment of the invention, a material of the separation layer includes a light absorbing material, a reflecting material, a scattering material, or a combination thereof.

In an embodiment of the invention, a portion of the epitaxial structure is located between the adjacent wavelength conversion structures.

Based on the above, in the micro light-emitting diode display panel according to the embodiments of the invention, the connected epitaxial structure may be used as a common electrode to electrically connect a plurality of micro light-emitting diodes. Subsequently, by disposing the wavelength conversion structures in the epitaxial structure, a thickness of the epitaxial structure in light-emitting areas and below the wavelength conversion structures may be reduced, and unevenness caused by disposing the wavelength conversion structures on a surface of the epitaxial structure may also be reduced. Therefore, compared with a conventional micro light-emitting diode display panel, the micro light-emitting diode display panel according to the embodiments of the invention has the advantages that the connected portion of the epitaxial structure is used as a common electrode to transfer currents, and a thick and unconnected portion of the epitaxial structure is retained to reduce power consumption. Furthermore, the thinned epitaxial structure may also enable the micro light-emitting diode display panel according to the embodiments of the invention to exhibit the effects of increasing the light output rate and reducing light leakage.

DESCRIPTION OF THE EMBODIMENTS

Figure 1A:
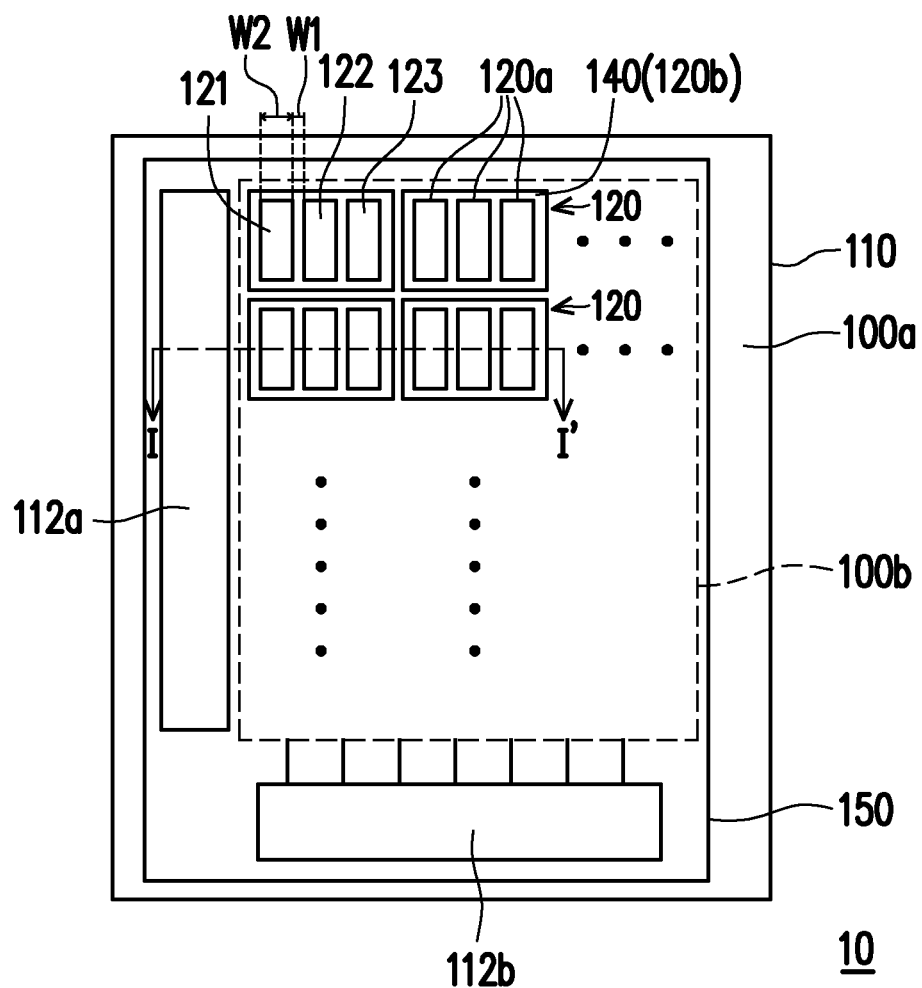
FIG. 1A is a schematic top view of a micro light-emitting diode display panel according to an embodiment of the invention.
Figure 1B:
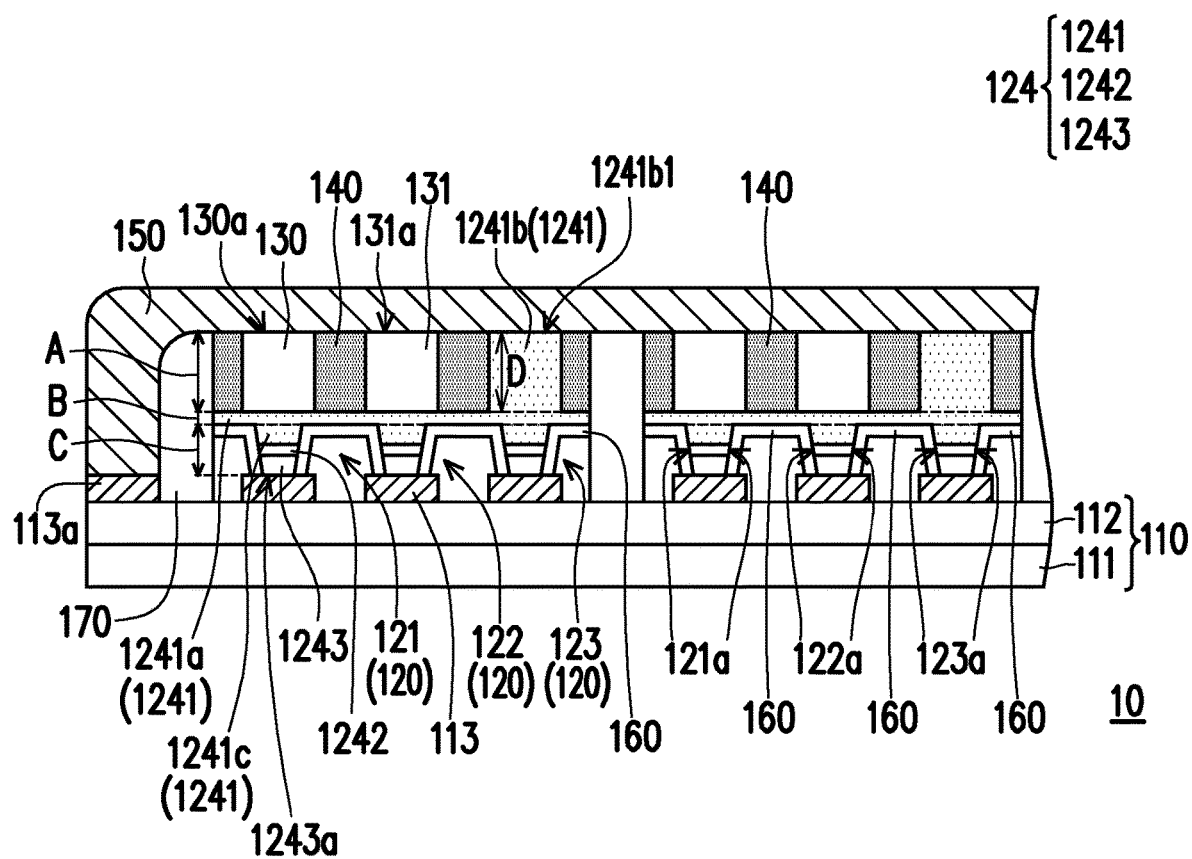
FIG. 1B is a schematic cross-sectional view of the micro light-emitting diode display panel in FIG. 1A taken along a section line I-I'.

FIG. 1A is a schematic top view of a micro light-emitting diode display panel according to an embodiment of the invention. FIG. 1B is a schematic cross-sectional view of the micro light-emitting diode display panel in FIG. 1A taken along a section line I-I'.

Referring to FIG. 1A and FIG. 1B together, a micro light-emitting diode display panel 10 of the present embodiment includes a substrate 110, a plurality of pixel structures 120, and a plurality of wavelength conversion structures 130 and 131. The substrate 110 includes a base 111 and a circuit layer 112 disposed on the base 111. The circuit layer 112 includes a first driving circuit 112a, a second driving circuit 112b, and a plurality of switch elements (not shown). The first driving circuit 112a and the second driving circuit 112b are located in a non-display area 100a of the micro light-emitting diode display panel 10. The base 111 may be, for example, a plastic substrate, a glass substrate, or a sapphire substrate, but is not limited thereto.

In the present embodiment, the pixel structures 120 are arranged into an array and are disposed on the substrate 110. The pixel structures 120 are located in a display area 100b of the micro light-emitting diode display panel 10. Each pixel structure 120 includes light-emitting areas 120a and non-light-emitting areas 120b. Each pixel structure 120 includes a plurality of micro light-emitting diodes 121, 122, and 123 disposed in the light-emitting areas 120a. In the present embodiment, a spacing W1 between the adjacent micro light-emitting diodes 121, 122, and 123 is, for example, less than or equal to 10 micrometers, and a width W2 of each of the micro light-emitting diodes 121, 122, and 123 is, for example, less than or equal to 10 micrometers, but the present embodiment is not limited thereto. In some embodiments, the spacing W1 between the adjacent micro light-emitting diodes 121, 122, and 123 is, for example, less than or equal to 5 micrometers, and the width W2 of each of the micro light-emitting diodes 121, 122, and 123 is, for example, less than or equal to 5 micrometers, so that the micro light-emitting diode display panel 10 has a high resolution.

Further, in the present embodiment, the spacing W1 between the adjacent micro light-emitting diodes 121, 122, and 123 is, for example, less than the width W2 of each of the micro light-emitting diodes 121, 122, and 123, so that the micro light-emitting diode display panel 10 has a high resolution, but the present embodiment is not limited thereto. In some embodiments, a ratio of the spacing W1 between the adjacent micro light-emitting diodes 121, 122, and 123 to the width W2 of each of the micro light-emitting diodes 121, 122, and 123, for example, range from 0.1 to 0.9, but is not limited thereto.

In the present embodiment, the micro light-emitting diodes 121, 122, and 123 may be vertical micro light-emitting diodes, but are not limited thereto. Specifically, the micro light-emitting diodes 121, 122, and 123 of the present embodiment are respectively disposed on contact pads 113 on the substrate 110. The micro light-emitting diodes 121, 122, and 123 and the substrate 110 are respectively located at two opposite sides of the contact pads 113. The micro light-emitting diodes 121, 122, and 123 are formed by a plurality of different portions of a connected epitaxial structure 124. The epitaxial structure 124 includes a first type semiconductor layer 1241 at least partially connected, a plurality of light-emitting layers 1242 separated from each other, and a plurality of second type semiconductor layers 1243 separated from each other. The light-emitting layers 1242 are disposed between the first type semiconductor layer 1241 and the second type semiconductor layers 1243.

More specifically, in the present embodiment, the first type semiconductor layer 1241 includes a connected portion 1241a, an unconnected portion 1241b, and a mesa portion 1241c. The unconnected portion 1241b is disposed on the connected portion 1241a. The unconnected portion 1241b and the mesa portion 1241c are respectively located at two opposite sides of the connected portion 1241a. The connected portion 1241a and the light-emitting layers 1242 are respectively located at two opposite sides of the mesa portion 1241c. The unconnected portion 1241b corresponds to the micro light-emitting diode 123 but does not correspond to the micro light-emitting diodes 121 and 122. That is, an orthographic projection of the unconnected portion 1241b onto the substrate 110 overlaps an orthographic projection of the micro light-emitting diode 123 onto the substrate 110 but does not overlap orthographic projections of the micro light-emitting diodes 121 and 122 onto the substrate 110. In some embodiments, the unconnected portion 1241b is disposed in a portion of the light-emitting areas 120a of the pixel structures 120. In the present embodiment, a material of the first type semiconductor layer 1241 is, for example, N-type doped GaN which can achieve a better electrical connection, but is not limited thereto.

In the present embodiment, the second type semiconductor layers 1243 and the substrate 110 are respectively located at two opposite sides of the contact pads 113. The second type semiconductor layers 1243 may be in contact with the contact pads 113 on the substrate 110. The second type semiconductor layers 1243 may be electrically connected to the circuit layer 112 of the substrate 110 through the contact pads 113 disposed on the substrate 110. That is, the micro light-emitting diodes 121, 122, and 123 may be electrically connected to the circuit layer 112 of the substrate 110 respectively through the corresponding contact pads 113.

In the present embodiment, the wavelength conversion structures 130 and 131 are disposed in the epitaxial structure 124 and are located on the micro light-emitting diodes 121 and 122. The wavelength conversion structures 130 and 131 are disposed in a portion of the light-emitting areas 120a of the pixel structures 120. Specifically, the wavelength conversion structure 130 is aligned with the micro light-emitting diode 121, and the wavelength conversion structure 131 is aligned with the micro light-emitting diode 122. The wavelength conversion structure 130 and the substrate 110 are respectively located at two opposite sides of the micro light-emitting diode 121, and the wavelength conversion structure 131 and the substrate 110 are respectively located at two opposite sides of the micro light-emitting diode 122. That is, an orthographic projection of the wavelength conversion structure 130 onto the substrate 110 overlaps an orthographic projection of the micro light-emitting diode 121 onto the substrate 110, and an orthographic projection of the wavelength conversion structure 131 onto the substrate 110 overlaps an orthographic projection of the micro light-emitting diode 122 onto the substrate 110. In some embodiments, the wavelength conversion structures 130 and 131 are in contact with the connected portion 1241a of the first type semiconductor layer 1241.

Furthermore, in the present embodiment, the unconnected portion 1241b of the first type semiconductor layer 1241 is located between the wavelength conversion structure 131 of one pixel structure 120 and the wavelength conversion structure 130 of another adjacent pixel structure 120. That is, a portion of the epitaxial structure 124 (namely the unconnected portion 1241b of the first type semiconductor layer 1241) may be located between the adjacent wavelength conversion structure 130 and wavelength conversion structure 131. In some embodiments, one end 1241b1 of a portion of the epitaxial structure 124 (namely the unconnected portion 1241b of the first type semiconductor layer 1241) away from the substrate 110 is coplanar with one end 130a and one end 131a of the wavelength conversion structures 130 and 131 away from the substrate 110.

Furthermore, in the present embodiment, a thickness A of each of the wavelength conversion structures 130 and 131 is, for example, 1 micrometer to 14 micrometers, a thickness B of the connected portion 1241a of the first type semiconductor layer 1241 is, for example, 0.3 micrometer to 3 micrometers. A distance C from the connected portion 1241a of the first type semiconductor layer 1241 to one end 1243a of each second type semiconductor layer 1243 away from the wavelength conversion structures 130 and 131 is, for example, 0.2 micrometer to 2 micrometers in a direction perpendicular to the substrate 110. A thickness D of the unconnected portion 1241b of the first type semiconductor layer 1241 is, for example, 3.0 micrometers to 14 micrometers. However, the present embodiment is not limited thereto.

In some embodiments, a ratio of the thickness A of each of the wavelength conversion structures 130 and 131 to the thickness B of the connected portion 1241a of the first type semiconductor layer 1241 is, for example, 1≤A/B≤50. Herein, if the ratio is less than 1, the wavelength conversion efficiency may be unfavorable, and if the ratio exceeds 50, the light output efficiency is affected due to large thickness. However, the embodiments are not limited thereto. In some embodiments, a ratio of the thickness A of each of the wavelength conversion structures 130 and 131 to the distance C from the connected portion 1241a of the first type semiconductor layer 1241 to one end 1243a of each second type semiconductor layer 1243 is, for example, 1.5≤A/C≤70. Herein, if the ratio is less than 1.5, the wavelength conversion efficiency may be unfavorable, and if the ratio exceeds 70, the light output efficiency is affected due to large thickness. However, the embodiments are not limited thereto. In some embodiments, a ratio of the thickness B of the connected portion 1241a of the first type semiconductor layer 1241 to the distance C from the connected portion 1241a of the first type semiconductor layer 1241 to one end 1243a of each second type semiconductor layer 1243 is, for example, 1.5≤B/C≤15. Herein, if the ratio is less than 1.5, the process yield of the connected portion 1241a is reduced, and if the ratio exceeds 15, the light output efficiency is affected due to large thickness. However, the embodiments are not limited thereto.

Furthermore, in the present embodiment, a thickness D of the unconnected portion 1241b of the first type semiconductor layer 1241 of the epitaxial structure 124 is, for example, greater than the thickness B of the connected portion 1241a of the first type semiconductor layer 1241. In some embodiments, a ratio of the thickness B of the connected portion 1241a of the first type semiconductor layer 1241 of the epitaxial structure 124 to the thickness D of the unconnected portion 1241b of the first type semiconductor layer 1241 is, for example, between 1 and 50. Herein, if the ratio is less than 1, the wavelength conversion efficiency may be unfavorable, and if the ratio exceeds 50, the light output efficiency is affected due to large thickness. However, the present embodiment is not limited thereto. In the present embodiment, a ratio of the thickness D of the unconnected portion 1241b of the first type semiconductor layer 1241 to the thickness A of each of the wavelength conversion structures 130 and 131 is, for example, between 0.9 and 1.1. However, the present embodiment is not limited thereto. In some embodiments, when the thickness D of the unconnected portion 1241b of the first type semiconductor layer 1241 is equal to the thickness A of each of the wavelength conversion structures 130 and 131, the micro light-emitting diode display panel 10 may have favorable light conversion quality and consistent light output efficiency.

In the present embodiment, the micro light-emitting diodes 121, 122, and 123 may be micro light-emitting diodes capable of emitting the same light, such as micro light-emitting diodes capable of emitting blue light or micro light-emitting diodes capable of emitting ultraviolet light, but are not limited thereto. The wavelength conversion structures 130 and 131 may have, for example, quantum dots, but are not limited thereto. The wavelength conversion structures 130 and 131 may have, for example, a plurality of different converted light colors. In some embodiments, the wavelength conversion structures 130 and 131 may have, for example, red, green, or blue converted light colors, but are not limited thereto. For example, when the micro light-emitting diodes 121, 122, and 123 are micro light-emitting diodes capable of emitting blue light, the micro light-emitting diode 121 may present red light through the corresponding wavelength conversion structure 130 having a red converted light color, the micro light-emitting diode 122 may present green light through the corresponding wavelength conversion structure 130 having a green converted light color, and the blue light emitted by the micro light-emitting diode 123 may pass through the unconnected portion 1241b of the corresponding first type semiconductor layer 1241 to present blue light. A pixel effect of full color display is thereby achieved.

In the present embodiment, although the first type semiconductor layer 1241 of the epitaxial structure 124 includes the unconnected portion 1241b, the invention is not limited thereto. That is, in other embodiments, the unconnected portion 1241b of the first type semiconductor layer 1241 may also be replaced with scattering materials, wavelength conversion structures, or other suitable materials as long as the replaced scattering materials, wavelength conversion structures, or other suitable materials do not affect the light output of the micro light-emitting diode 123.

In the present embodiment, the micro light-emitting diode display panel 10 further includes light blocking layers 140. The light blocking layers 140 are disposed between the epitaxial structure 124 and the wavelength conversion structures 130. The light blocking layers 140 are disposed in the non-light-emitting areas 120b of the pixel structures 120. Specifically, the light blocking layers 140 are located at left and right sides of the wavelength conversion structures 130 and 131 and are located at left and right sides of the unconnected portion 1241b of the first type semiconductor layer 1241. The light blocking layers 140 are located on the connected portion 1241a of the first type semiconductor layer 1241. The light blocking layers 140 are in contact with the connected portion 1241a of the first type semiconductor layer 1241. The light blocking layers 140 are disposed between the adjacent wavelength conversion structures 130 and 131, and the light blocking layers 140 are disposed between the wavelength conversion structures 130 and 131 and the unconnected portion 1241b of the first type semiconductor layer 1241. In some embodiments, orthographic projections of the light blocking layers 140 onto the substrate 110 do not overlap orthographic projections of the micro light-emitting diodes 121, 122, and 123 onto the substrate 110. Furthermore, in the present embodiment, the light blocking layers 140 may have the characteristics of reflection, scattering or light absorption, so as to prevent the light emitted by the micro light-emitting diodes 121, 122, and 123 from interfering with each other, and reduce light leakage. In some embodiments, the light blocking layers 140 may have electrical conductivity, so that the light blocking layers 140 may be electrically connected to the connected portion 1241a of the first type semiconductor layer 1241 so as to increase transverse conductivity and reduce power consumption.

In the present embodiment, the micro light-emitting diode display panel 10 further includes a common electrode layer 150 having a light transmitting property. The common electrode layer 150 is disposed on the pixel structures 120 and electrically connected to the first type semiconductor layer 1241. Specifically, the common electrode layer 150 covers the wavelength conversion structures 130 and 131, the light blocking layers 140 and the micro light-emitting diodes 121, 122, and 123. The common electrode layer 150 may be in contact with the wavelength conversion structures 130 and 131, the light blocking layers 140 and the unconnected portion 1241b of the first type semiconductor layer 1241. Therefore, the common electrode layer 150 may be electrically connected to the micro light-emitting diodes 121, 122, and 123 through the unconnected portion 1241b and the connected portion 1241a of the first type semiconductor layer 1241. In some embodiments, the common electrode layer 150 may also be electrically connected to the micro light-emitting diodes 121, 122, and 123 through the light blocking layers 140 having electrical conductivity and the connected portion 1241a of the first type semiconductor layer 1241. Furthermore, in the present embodiment, the common electrode layer 150 may also be electrically connected to the circuit layer 112 of the substrate 110 through the contact pads 113a on the substrate 110.

In the present embodiment, the micro light-emitting diode display panel 10 further includes separation layers 160. The separation layers 160 are disposed on side walls 121a, 122a and 123a of the micro light-emitting diodes 121, 122, and 123 and on the connected portion 1241a of the epitaxial structure 124 among the micro light-emitting diodes 121, 122, and 123. In the present embodiment, a material of the separation layers 160 may be, for example, a light absorbing material, a reflecting material, a scattering material, or a combination thereof, but is not limited thereto. The separation layers 160 may be configured to prevent the light emitted by the micro light-emitting diodes 121, 122, and 123 from interfering with each other, and reduce light leakage. In some embodiments, the separation layers 160 may be a distribution Bragg reflector (DBR), but are not limited thereto.

In the present embodiment, the micro light-emitting diode display panel 10 further includes a protection layer 170 disposed on the substrate 110. The protection layer 170 is disposed between the common electrode layer 150 and the pixel structures 120 and disposed between the adjacent pixel structures 120, and is configured to protect the micro light-emitting diode display panel 10 from generating moisture or oxidation.

It is worth mentioning that in the micro light-emitting diode display panel 10 of the present embodiment, the connected first type semiconductor layer 1241 may be used as a common electrode to electrically connect a plurality of micro light-emitting diodes 121, 122, and 123. Subsequently, by disposing the wavelength conversion structures 130 and 131 in the first type semiconductor layer 1241, the thickness of the first type semiconductor layer 1241 in light-emitting areas 120b may be reduced, and unevenness caused by disposing the wavelength conversion structures 130 and 131 on a surface of the epitaxial structure 124 may also be reduced. Therefore, compared with a conventional micro light-emitting diode display panel, the micro light-emitting diode display panel 10 of the invention has the advantages that the thinned connected portion of the epitaxial structure 124 (namely the connected portion 1241a of the first type semiconductor layer 1241) is used as a common electrode to transfer currents, and the thick unconnected portion of the epitaxial structure 124 (namely the unconnected portion 1241b of the first type semiconductor layer 1241) is retained to reduce power consumption. Furthermore, the thinned first type semiconductor layer 1241 may also enable the micro light-emitting diode display panel 10 of the invention to have the effects of increasing the light output rate and reducing light leakage.

Other embodiments will be listed below for illustration. It should be noted that the following embodiments follow the component symbols and partial contents of the above embodiments, same symbols are adopted to represent same or similar components, and the descriptions of the same technical contents are omitted. The descriptions of the omitted portions can be understood by referring to the above embodiments, and the descriptions are omitted in the following embodiments.

Figure 2:
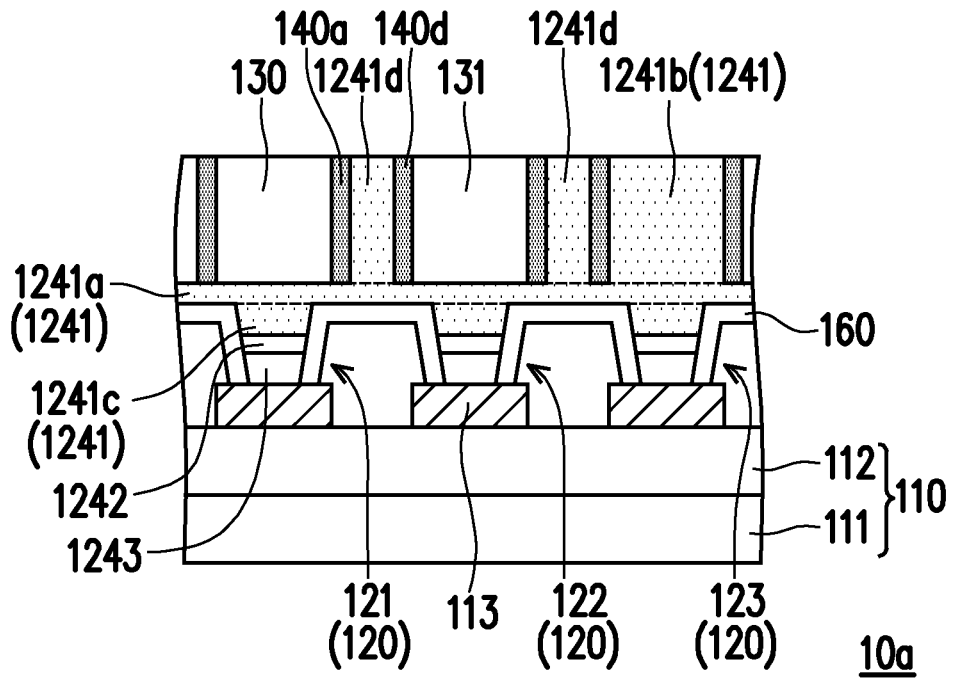
FIG. 2 is a schematic cross-sectional view of a micro light-emitting diode display panel according to another embodiment of the invention.

FIG. 2 is a schematic cross-sectional view of a micro light-emitting diode display panel according to another embodiment of the invention. For clarity of illustration and description, FIG. 2 omits the common electrode layer 150 and the protection layer 170. Referring to FIG. 1B and FIG. 2 together, a micro light-emitting diode display panel 10a of the present embodiment is similar to the micro light-emitting diode display panel 10 in FIG. 1B, and the main difference between the micro light-emitting diode display panel 10a and the micro light-emitting diode display panel 10 is as follows: the micro light-emitting diode display panel 10a of the present embodiment further includes an unconnected portion 1241*d* of a first type semiconductor layer 1241.

Referring to FIG. 2, the unconnected portion 1241*d* of the first type semiconductor layer 1241 is disposed in non-light-emitting areas 120*b* of pixel structures 120, so that light blocking layers 140*a* and 140*b* are respectively located at two opposite sides of the unconnected portions 1241*d*. Specifically, the light blocking layer 140*a* is located between a wavelength conversion structure 130 and the unconnected portion 1241*d*, and the light blocking layer 140*b* is located between a wavelength conversion structure 131 and the unconnected portion 1241*d*. An orthographic projection of the light blocking layer 140*a* onto a substrate 110 does not overlap orthographic projections of the micro light-emitting diodes 121, 122, and 123 on the substrate 110. In the present embodiment, because the unconnected portion 1241*d* may be in contact with the common electrode layer 150 (not shown), the common electrode layer 150 may be electrically connected to the micro light-emitting diodes 121, 122, and 123 through the unconnected portion 1241*b*, the unconnected portion 1241*d* and the connected portion 1241*a* of the first type semiconductor layer 1241. Therefore, the power consumption may be reduced and a higher current may be transferred so as to provide higher brightness.

Figure 3:
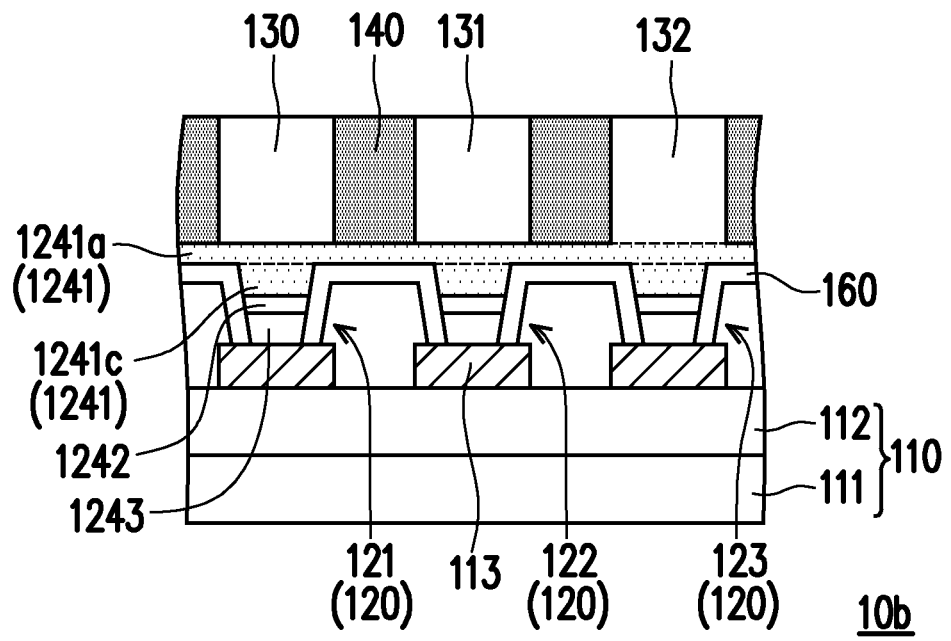
FIG. 3 is a schematic cross-sectional view of a micro light-emitting diode display panel according to another embodiment of the invention.

FIG. 3 is a schematic cross-sectional view of a micro light-emitting diode display panel according to another embodiment of the invention. For clarity of illustration and description, in FIG. 3, a common electrode layer 150 and a protection layer 170 are omitted. Referring to FIG. 1B and FIG. 3 together, a micro light-emitting diode display panel 10*b* of the present embodiment is similar to the micro light-emitting diode display panel 10 in FIG. 1B, and the main difference between the micro light-emitting diode display panel 10*b* and the micro light-emitting diode display panel 10 is as follows: in the micro light-emitting diode display panel 10*b* of the present embodiment, the unconnected portion 1241*b* of the first type semiconductor layer 1241 in the micro light-emitting diode display panel 10 is replaced with a wavelength conversion structure 132.

Referring to FIG. 3, the wavelength conversion structure 132 is disposed in light-emitting areas 120*a* of pixel structures 120, and the wavelength conversion structure 132 is aligned with a micro light-emitting diode 123. Therefore, when the micro light-emitting diodes 121, 122, and 123 are micro light-emitting diodes capable of emitting ultraviolet light, the micro light-emitting diode 121 may present red light through the corresponding wavelength conversion structure 130 having a red converted light color, the micro light-emitting diode 122 may present green light through the corresponding wavelength conversion structure 130 having a green converted light color, and the micro light-emitting diode 123 may present blue light through the corresponding wavelength conversion structure 132 having a blue converted light color. The pixel effect of full color display is thereby achieved.

Figure 4:
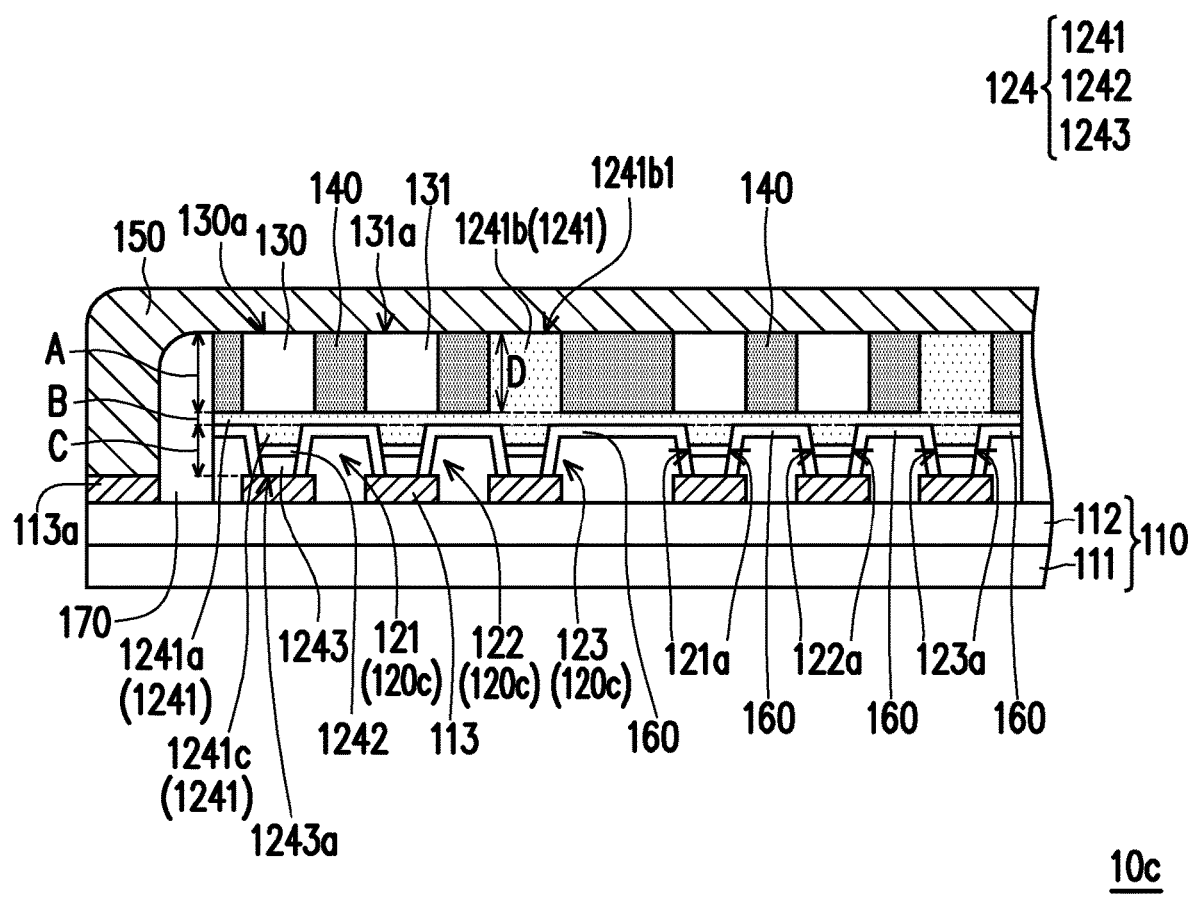
FIG. 4 is a schematic cross-sectional view of a micro light-emitting diode display panel according to another embodiment of the invention.

FIG. 4 is a schematic cross-sectional view of a micro light-emitting diode display panel according to another embodiment of the invention. Referring to FIG. 1B and FIG. 4 together, a micro light-emitting diode display panel 10*c* of the present embodiment is similar to the micro light-emitting diode display panel 10 in FIG. 1B, and the main difference between the micro light-emitting diode display panel 10*c* and the micro light-emitting diode display panel 10 is as follows: in the micro light-emitting diode display panel 10*c* of the present embodiment, pixel structures 120*c* are connected to each other. The pixel structures 120*c* are connected through a connected portion 1241*a* of a first type semiconductor layer 1241 in an epitaxial structure 124, so that in a process of manufacturing the micro light-emitting diode display panel 10*c*, micro light-emitting diodes 121, 122, and 123 do not deviate during transfer, the transfer number may also be reduced, and the manufacturing yield may be increased. In particular, all pixel structures in the micro light-emitting diode display panel may be connected, and partial pixel structures may be connected according to a transfer design. However, the present embodiment is not limited thereto.

In conclusion, in the micro light-emitting diode display panel according to the embodiments of the invention, the connected first type semiconductor layer may be used as a common electrode to electrically connect the plurality of micro light-emitting diodes. Subsequently, by disposing the wavelength conversion structures in the first type semiconductor layer, the thickness of the first type semiconductor layer in light-emitting areas and below the wavelength conversion structures may be reduced, and unevenness caused by disposing the wavelength conversion structures on the surface of the epitaxial structure may also be reduced. Therefore, compared with a conventional micro light-emitting diode display panel, the micro light-emitting diode display panel according to the embodiments of the invention has the advantages that the connected portion of the epitaxial structure is used as a common electrode to transfer currents, and the unconnected portion of the epitaxial structure is retained to reduce power consumption. Furthermore, the thinned first type semiconductor layer may also be configured to enable the micro light-emitting diode display panel according to the embodiments of the invention to exhibit the effects of increasing the light output rate and reducing light leakage.

What is claimed is:

1. A micro light-emitting diode display panel, comprising:
a substrate;
a plurality of pixel structures disposed on the substrate, wherein each pixel structure comprises a plurality of micro light-emitting diodes, and the micro light-emitting diodes are a plurality of different portions of a connected epitaxial structure, wherein the epitaxial structure comprises a first type semiconductor layer including a connected portion, a plurality of mesa portions and an unconnected portion, which are integrally formed, the unconnected portion and the plurality of mesa portions are located at two opposite sides of the connected portion, a plurality of light-emitting layers separated from each other, and a plurality of second type semiconductor layers separated from each other, the light-emitting layers are disposed between the mesa portions and the second type semiconductor layers, each of the micro light-emitting diodes including one of the mesa portions, one of the light-emitting layers and one of the second type semiconductor layers, and the unconnected portion and the plurality of micro light-emitting diodes are respectively located at two opposite sides of the connected portion;
a plurality of wavelength conversion structures disposed in the epitaxial structure and respectively aligned with at least a portion of the micro light-emitting diodes; and
a light blocking layer disposed between the unconnected portion and the wavelength conversion structures, wherein an orthographic projection of the light blocking layer onto the substrate and an orthographic projection of the unconnected portion onto the substrate both do not overlap an orthographic projection of the plurality of micro light-emitting diodes onto the substrate.

2. The micro light-emitting diode display panel according to claim 1, wherein a thickness of each wavelength conversion structure is greater than a thickness of the connected portion of the first type semiconductor layer.

3. The micro light-emitting diode display panel according to claim 1, wherein the micro light-emitting diode display panel meets a condition that: $1 \leq A/B \leq 50$, $1.5 \leq A/C \leq 70$, and $1.5 \leq B/C \leq 15$, wherein A is a thickness of each of the wavelength conversion structures, B is a thickness of the connected portion of the first type semiconductor layer, and C is a distance from the connected portion of the first type semiconductor layer to one end of each second type semiconductor layer away from the wavelength conversion structures in a direction perpendicular to the substrate.

4. The micro light-emitting diode display panel according to claim 1, wherein a thickness of the unconnected portion is greater than a thickness of the connected portion.

5. The micro light-emitting diode display panel according to claim 4, wherein a ratio of the thickness of the unconnected portion to a thickness of the wavelength conversion structure is between 0.9 and 1.1.

6. The micro light-emitting diode display panel according to claim 1, further comprising a common electrode layer disposed on the pixel structures and electrically connected to the first type semiconductor layer of the epitaxial structure.

7. The micro light-emitting diode display panel according to claim 1, wherein one end of a portion of the epitaxial structure away from the substrate is coplanar with one end of each wavelength conversion structure away from the substrate.

8. The micro light-emitting diode display panel according to claim 1, wherein the light blocking layer has electrical conductivity.

9. The micro light-emitting diode display panel according to claim 1, wherein a spacing between the micro light-emitting diodes is less than a width of each micro light-emitting diode.

10. The micro light-emitting diode display panel according to claim 9, wherein a ratio of the spacing between the micro light-emitting diodes and the width of each micro light-emitting diode ranges from 0.1 to 0.9.

11. The micro light-emitting diode display panel according to claim 9, wherein the spacing between the micro light-emitting diodes is less than or equal to 10 micrometers.

12. The micro light-emitting diode display panel according to claim 1, further comprising a separation layer disposed on side walls of the micro light-emitting diodes and on the connected portion among the micro light-emitting diodes.

13. The micro light-emitting diode display panel according to claim 12, wherein a material of the separation layer comprises a light absorbing material, a reflecting material, a scattering material, or a combination thereof.

14. The micro light-emitting diode display panel according to claim 1, wherein the unconnected portion is located between the adjacent wavelength conversion structures.

* * * * *